United States Patent
Makiyama

(10) Patent No.: US 10,727,305 B2
(45) Date of Patent: Jul. 28, 2020

(54) SEMICONDUCTOR DEVICE AND FABRICATION METHOD THEREFOR, AND HIGH-FREQUENCY AMPLIFIER

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/174,596

(22) Filed: Oct. 30, 2018

(65) Prior Publication Data

US 2019/0189757 A1    Jun. 20, 2019

(30) Foreign Application Priority Data

Dec. 20, 2017 (JP) .................. 2017-243625

(51) Int. Cl.
| | | |
|---|---|---|
| H01L 29/20 | (2006.01) | |
| H01L 29/66 | (2006.01) | |
| H01L 29/10 | (2006.01) | |
| H01L 29/205 | (2006.01) | |
| H01L 29/778 | (2006.01) | |
| H01L 29/201 | (2006.01) | |
| H01L 29/417 | (2006.01) | |

(52) U.S. Cl.
CPC ...... *H01L 29/2003* (2013.01); *H01L 29/1033* (2013.01); *H01L 29/201* (2013.01); *H01L 29/205* (2013.01); *H01L 29/66462* (2013.01); *H01L 29/7786* (2013.01); *H01L 29/41766* (2013.01)

(58) Field of Classification Search
CPC ............ H01L 23/291; H01L 23/3171; H01L 23/3192; H01L 29/66; H01L 29/66462; H01L 29/7787; H01L 29/42316; H01L 29/42364; H01L 29/08; H01L 29/10; H01L 29/15; H01L 29/40; H01L 29/78; H01L 29/201; H01L 29/205; H01L 29/155; H01L 29/423; H01L 29/778; H01L 29/2003; H01L 29/1033; H01L 29/7786; H01L 29/41766; H01L 29/42372; H01L 29/0847; H01L 29/4236; H01L 29/407; H01L 29/475
USPC ......................................................... 257/76
See application file for complete search history.

(56) References Cited

U.S. PATENT DOCUMENTS

| | | |
|---|---|---|
| 2007/0164315 A1 | 7/2007 | Smith et al. |
| 2014/0197460 A1 | 7/2014 | Makiyama |
| 2017/0117402 A1* | 4/2017 | Koyama ............ H01L 21/3245 |

FOREIGN PATENT DOCUMENTS

| | | |
|---|---|---|
| JP | 2008-227501 A | 9/2008 |
| JP | 2014-138110 A | 7/2014 |

* cited by examiner

*Primary Examiner* — Chuong A Luu
(74) *Attorney, Agent, or Firm* — Westerman, Hattori, Daniels & Adrian, LLP

(57) ABSTRACT

A semiconductor device includes a nitride semiconductor stacked structure that includes a channel layer containing GaN and a barrier layer containing In and further includes a cap layer that contains GaN on the outermost surface but does not contain Al. The cap layer has a Ga/N ratio that varies along a thicknesswise direction.

5 Claims, 9 Drawing Sheets

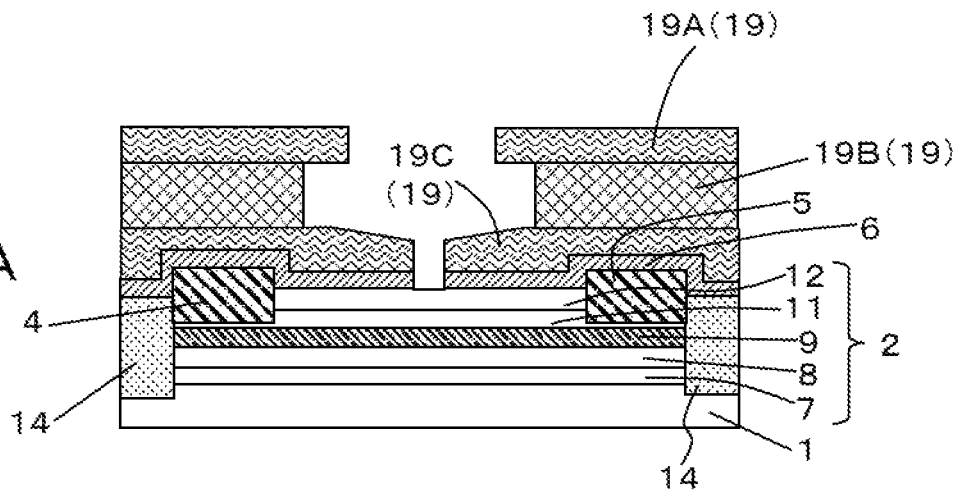
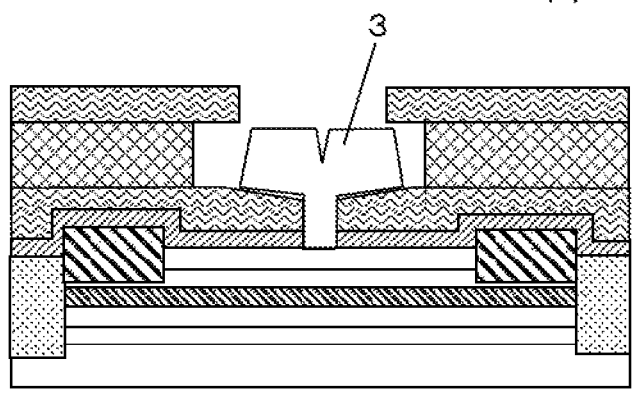
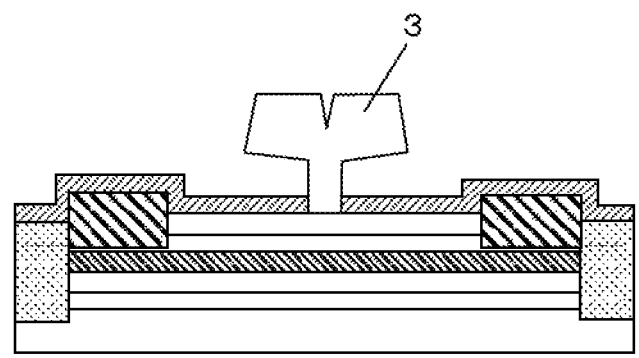
FIG. 5A
FIG. 5B
FIG. 5C

FIG. 6A
FIG. 6B
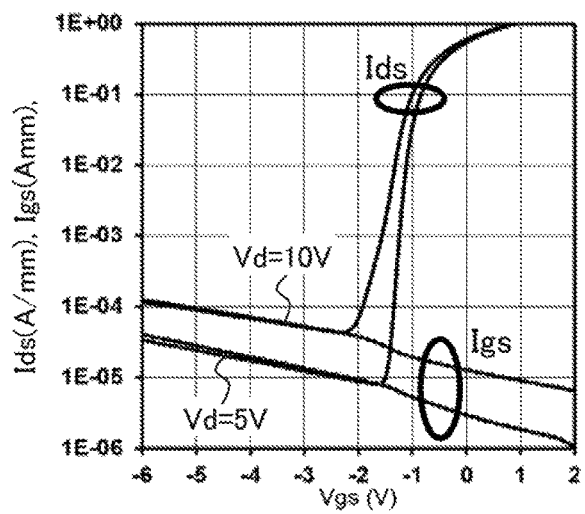
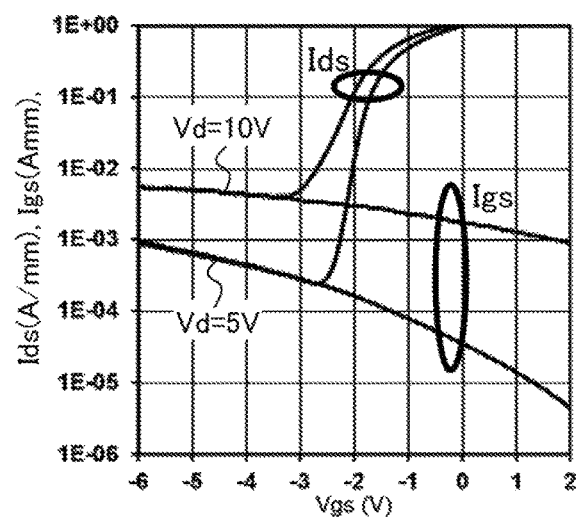

SEMICONDUCTOR DEVICE AND FABRICATION METHOD THEREFOR, AND HIGH-FREQUENCY AMPLIFIER

CROSS-REFERENCE TO RELATED APPLICATION

This application is based upon and claims the benefit of priority of the prior Japanese Patent Application No. 2017-243625, filed on Dec. 20, 2017, the entire contents of which are incorporated herein by reference.

FIELD

The embodiment discussed herein relates to a semiconductor device and a fabrication method therefor as well as a high-frequency amplifier.

BACKGROUND

As a semiconductor device that includes, for example, a nitride semiconductor stacked structure for which a nitride semiconductor is used, a high electron mobility transistor (High Electron Mobility Transistor: HEMT; GaN HEMT) in which, for example, GaN is used for a channel layer (electron transit layer) is available.

As such a GaN HEMT as just described, for example, a HEMT in which, for example, AlGaN, InAlN, InAlGaN or the like is used for a barrier layer (electron supply layer) is available.

Also a HEMT is available in which a cap layer for which, for example, AlGaN, GaN or the like is used is provided on the outermost surface of a nitride semiconductor stacked structure.

SUMMARY

According to one aspect of the embodiment, a semiconductor device includes a nitride semiconductor stacked structure that includes a channel layer containing GaN and a barrier layer containing In and further includes a cap layer that contains GaN on the outermost surface but does not contain Al, wherein, in the cap layer, a Ga/N ratio varies along a thicknesswise direction.

According to another aspect of the embodiment, a high-frequency amplifier includes an amplifier that amplifies an input signal, wherein the amplifier includes a transistor; the transistor has a nitride semiconductor stacked structure that includes a channel layer containing GaN and a barrier layer containing In and further includes a cap layer that contains GaN on the outermost surface but does not contain Al, and in the cap layer, a Ga/N ratio varies along a thicknesswise direction.

According to a further aspect of the embodiment, a fabrication method for a semiconductor device includes forming a nitride semiconductor stacked structure that includes a channel layer containing GaN and a barrier layer containing In and further includes a cap layer that contains GaN on the outermost surface but does not contain Al, and varying a Ga/N ratio of the cap layer along the thicknesswise direction.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 3A to 3C, 4A to 4E and FIGS. 5A to 5C are schematic sectional views illustrating a fabrication method for the semiconductor device according to the first embodiment;

FIG. 6A is a view depicting a characteristic (Ids-Vgs characteristic) of an InAlGaN/GaN HEMI that does not include a GaN cap layer, and FIG. 6B is a view depicting a characteristic (Ids-Vgs characteristic) of an InAlGaN/GaN HEMT that includes a GaN cap layer that is poor in quality;

FIG. 8A is a band diagram depicting conduction band energy in a GaN cap layer, an InAlGaN barrier layer and a GaN electron transit layer in the case where a GaN cap layer having high quality can be formed; and FIG. 8B is a band diagram depicting conduction band energy in a GaN cap layer, an InAlGaN barrier layer and a GaN electron transit layer that are low in quality.

DESCRIPTION OF EMBODIMENTS

However, in the case where a cap layer is provided in order to protect the surface of a nitride semiconductor stacked structure from oxidation, it is preferable to configure the cap layer so as not to contain Al that is liable to be oxidized.

For example, while it is conceivable to use GaN for the cap layer, in the case where a material containing In such as, for example, InAlN or InAlGaN is used for a barrier layer, it is difficult to form a GaN cap layer having high quality.

Further, it has been found that, in a GaN cap layer that is poor in quality, a donor or the like is formed by N vacancies or the like to cause excessive positive charge to be generated and this has an influence on an electric characteristic such as, for example, a threshold value voltage or a pinch-off characteristic.

The present embodiment contemplates suppression of an influence, in the case where a material containing In is used for a barrier layer and a cap layer that includes GaN but does not include Al is provided, of the cap layer on an electric characteristic such as, for example, a threshold value voltage or a pinch-off characteristic.

In the following, a semiconductor device and a fabrication method therefor as well as a high-frequency amplifier according to embodiments of the present technology are described with reference to the drawings.

First Embodiment

First, a semiconductor device and a fabrication method therefor according to the first embodiment are described with reference to FIGS. 1 to 8B.

The semiconductor device according to the present embodiment is a semiconductor device including a nitride semiconductor stacked structure for which, for example, a nitride semiconductor is used.

Here, description is given taking, as an example, a field electric transistor (FET) for which a nitride semiconductor is used, in particular, an InAlGaN/GaN HEMT including a nitride semiconductor stacked structure (HEMT structure) that is used, for example, in a high-output device or a high-frequency device and in which GaN is used for an electron transit layer (channel layer) and InAlGaN that is an In-based nitride semiconductor capable of inducing two-dimensional electron gas having a high concentration is used for an electron supply layer (barrier layer).

Figure 1:
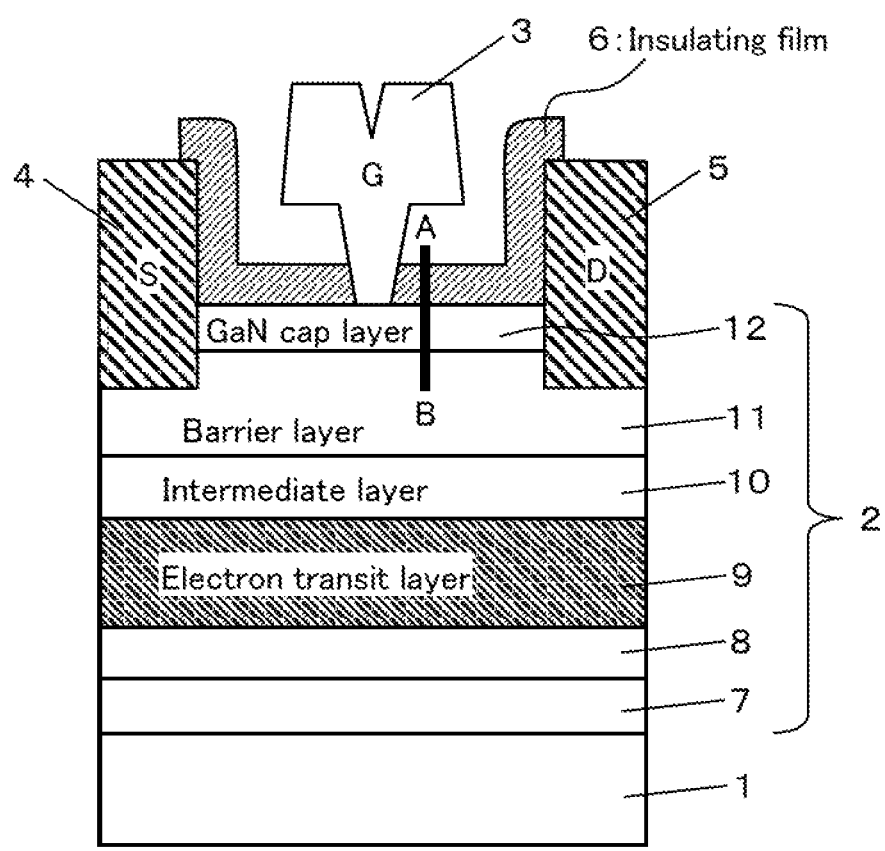
FIG. 1 is a schematic sectional view depicting a configuration of a semiconductor device according to a first embodiment.

For example, as depicted in FIG. 1, the semiconductor device according to the present embodiment includes a nitride semiconductor stacked structure 2 configured from a plurality of semiconductor layers stacked on a semiconductor substrate 1, a gate electrode 3, a source electrode 4 and a drain electrode 5 provided over the nitride semiconductor stacked structure 2, and an insulating film 6 that covers the surface of the nitride semiconductor stacked structure 2.

Here, the nitride semiconductor stacked structure 2 is structured such that, for example, a nucleation layer 7, a buffer layer 8, a GaN electron transit layer 9, an AlN intermediate layer 10, an InAlGaN barrier layer (electron supply layer) 11 and a GaN cap layer (surface layer) 12 are stacked in order on an SiC substrate 1 having a semi-insulating property, and the GaN cap layer 12 configures the outermost surface of the nitride semiconductor stacked structure 2. In short, the GaN cap layer 12 here is stacked on the InAlGaN/GaN HEMT to configure the nitride semiconductor stacked structure 2.

It is to be noted that a HEMI having such a nitride semiconductor stacked structure 2 as described above is referred to also as GaN/InAlGaN/AlN/GaN HEMI. Further, the intermediate layer 10 between the electron transit layer 9 and the barrier layer 11 may be inserted as occasion demands. Also the nucleation layer 7 or the buffer layer 8 may be provided as occasion demands.

Further, the gate electrode 3 is formed on the GaN cap layer 12, and the source electrode 4 and the drain electrode 5 as a pair of ohmic electrodes are formed on the InAlGaN barrier layer 11 at both sides across the gate electrode 3.

Further, the insulating film 6 is formed so as to cover the surface of the GaN cap layer 12 on the outermost surface of the nitride semiconductor stacked structure 2, the surface of the source electrode 4 and the surface of the drain electrode 5. Here, the insulating film 6 is, for example, a nitride silicon film (SiN film) or the like.

It is to be noted that the insulating film 6 may cover at least the surface of the nitride semiconductor stacked structure 2. In particular, the insulating film 6 may cover exposed regions of the semiconductor surface between the source electrode 4 and the gate electrode 3 and between the gate electrode 3 and the drain electrode 5.

Figure 2A:
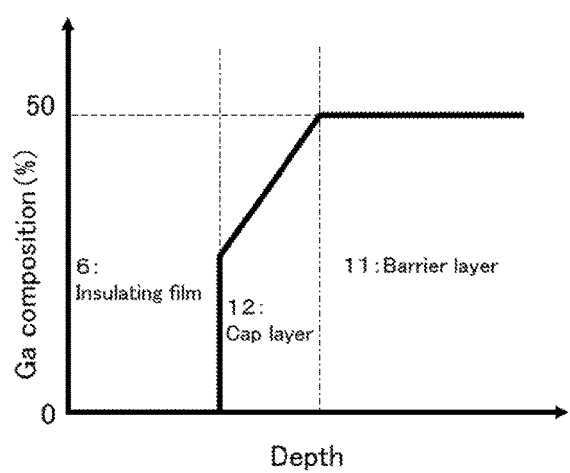
FIG. 2A is a view depicting variation of a Ga composition in a GaN cap layer included in the semiconductor device according to the first embodiment.
Figure 2B:
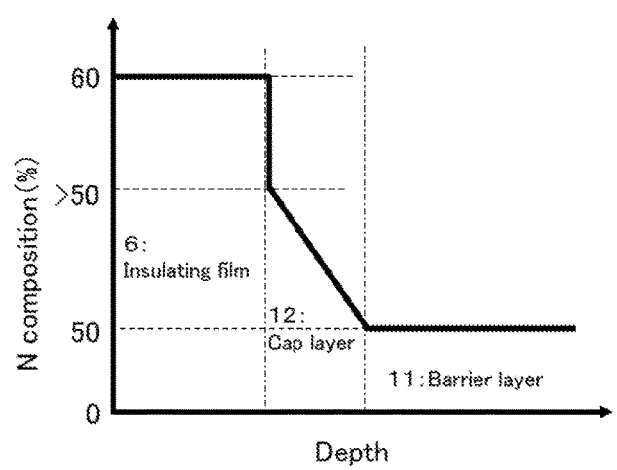
FIG. 2B is a view depicting variation of an N composition in a GaN cap layer included in the semiconductor device according to the first embodiment.

Especially, in the present embodiment, the GaN cap layer 12 has a Ga/N ratio that varies along a thicknesswise direction [for example, refer to FIGS. 2A and 2B].

Here, for example, as depicted in FIG. 2A, the GaN cap layer 12 has a Ga composition that is low at the surface side but is high at the opposite side to the surface side (barrier layer side). Further, for example, as depicted in FIG. 2B, the GaN cap layer 12 has an N composition that is high at the surface side but is low at the opposite side to the surface side (barrier layer side). It is to be noted that FIG. 2A depicts variation of the Ga composition on a cross section taken along line A-B of FIG. 1, and FIG. 2B depicts variation of the N composition on a cross section taken along line A-B of FIG. 1.

By such a configuration as described above, in the GaN cap layer 12, the influence of excessive positive charge by a donor formed from N vacancies is suppressed by an accepter by Ga vacancies formed at the surface side (compensation effect of a surface donor).

Further, in the GaN cap layer 12, N diffused from the surface side is coupled to N vacancies to reduce the donor formed from the N vacancies such that the influence of excessive positive charge by the donor formed from the N vacancies is suppressed (reduction effect of a surface donor).

Consequently, in the case where the GaN cap layer 12 is provided on the InAlGaN barrier layer 11 that is an In-based nitride semiconductor, the influence of excessive positive charge is suppressed such that it is not had the influence on an electric characteristic such as, for example, a threshold value voltage or a pinch off characteristic.

Further, the GaN cap layer 12 here contains Si by 1% or more. In particular, since the GaN cap layer 12 has a composition that varies as described above by performing an annealing process using a sacrifice film 13 containing Si as hereinafter described [for example, refer to FIG. 3B], the GaN cap layer 12 contains Si by 1% or more.

It is to be noted that, while the electron transit layer 9 here is configured as a GaN electron transit layer, the electron transit layer 9 may be any electron transit layer (channel layer) only if it contains GaN.

Further, while the barrier layer 11 here is configured as an InAlGaN barrier layer, the barrier layer 11 may be any barrier layer if it contains In. In short, the barrier layer 11 disposed under the GaN cap layer 12 may be configured from a material that contains In.

Further, while the cap layer 12 here is configured as a GaN cap layer, it may be a cap layer that contains GaN but does not contain Al. For example, the cap layer 12 may further contain In. In other words, the cap layer 12 may be a cap layer that contains InGaN but does not contain Al. For example, the cap layer 12 may be configured as an InGaN cap layer. Also in this case, a working effect similar to that in the case where the cap layer 12 is configured as a GaN cap layer is obtained.

Further, while the GaN cap layer 12 is configured such that the Ga composition is low at the surface side but is high at the opposite side to the surface side (at the barrier layer side) and besides the N composition is high at the surface side but is low at the opposite side to the surface side (at the barrier layer side), the configuration of the GaN cap layer 12 is not limited to this.

For example, the GaN cap layer 12 may be configured only such that the Ga composition is low at the surface side but is high at the opposite side to the surface side (at the barrier layer side).

By this configuration, in the GaN cap layer 12, the influence of excessive charge by a donor formed from N vacancies can be suppressed by an accepter by Ga vacancies formed at the surface side (compensation effect of a surface donor).

As a result, in the case where the GaN cap layer 12 is provided on the InAlGaN barrier layer 11 that is an In-based nitride semiconductor, the influence of excessive positive charge is suppressed such that it is not had the influence on an electric characteristic such as, for example, a threshold value voltage or a pinch off characteristic.

Further, for example, the GaN cap layer 12 may be configured only such that the N composition is high at the surface side but is low at the opposite side to the surface side (at the barrier layer side).

Consequently, in the GaN cap layer 12, N diffused from the surface side is coupled to N vacancies to reduce a donor to be formed from the N vacancies such that the influence of excessive positive charge by the donor formed from the N vacancies can be suppressed (reduction effect of a surface donor).

As a result, in the case where the GaN cap layer 12 is provided on the InAlGaN barrier layer 11 that is an In-based nitride semiconductor, the influence of excessive positive charge is suppressed, and the influence on the electric characteristic such as, for example, a threshold value voltage or a pinch off characteristic can be suppressed.

Now, the fabrication method for a semiconductor device according to the present embodiment is described with reference to FIGS. 3A to 3C, 4A to 4E and 5A to 5C.

Figure 3A:
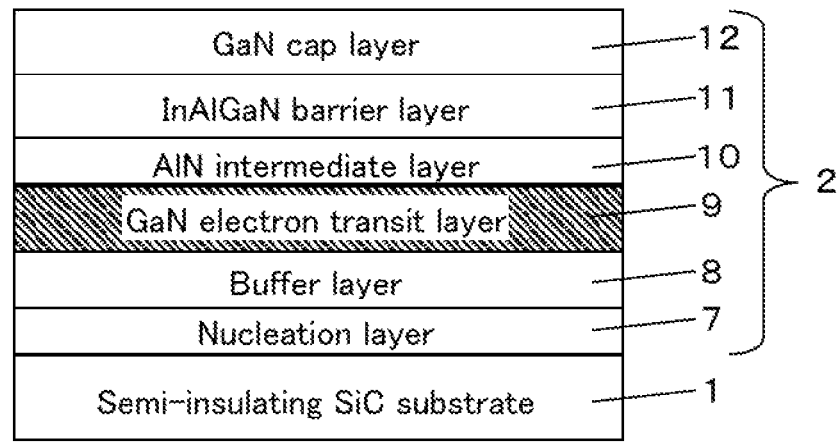

First, as depicted in FIG. 3A, a nucleation layer 7, a buffer layer 8, a GaN electron transit layer (channel layer) 9, an AlN intermediate layer 10, an InAlGaN electron supplying layer (barrier layer) 11 and a GaN cap layer 12 are epitaxially grown in this order on a semi-insulating SiC substrate (semiconductor substrate) 1, for example, by a metal organic vacuum phase epitaxy (MOVPE) method to form a nitride semiconductor stacked structure 2 in which the plurality of semiconductor layers 7 to 12 are stacked.

In this case, the nucleation layer 7, buffer layer 8, electron transit layer 9, intermediate layer 10, barrier layer 11 and cap layer 12 formed on the SiC substrate 1 configure the nitride semiconductor stacked structure 2 (nitride semiconductor region; compound semiconductor region). It is to be noted that the intermediate layer 10 between the electron transit layer 9 and the barrier layer 11 may be inserted as occasion demands.

This step is a step of forming the nitride semiconductor stacked structure 2 that includes the channel layer 9 containing GaN and the barrier layer 11 containing In and includes the cap layer 12 that contains GaN but does not contain Al on the outermost surface.

Figure 3B:
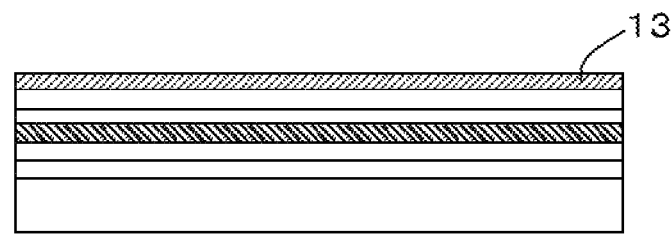

Then, as depicted in FIG. 3B, the Ga/N ratio of the GaN cap layer 12 is varied along the thicknesswise direction. It is to be noted that illustration of the intermediate layer is omitted in the figures of the succeeding steps.

In particular, for example, a nitride silicon film (SiN film; insulating film) is formed first as the sacrifice film 13 on the GaN cap layer 12 provided on the outermost surface of the nitride semiconductor stacked structure 2.

Here, SiN is deposited, for example, by approximately 100 nm in thickness on the surface of the GaN cap layer 12 provided on the outermost surface of the nitride semiconductor stacked structure 2 using, for example, $SiH_4$ and $NH_3$ as a material (material gas), for example, by a plasma CVD (PCVD) method to form a SiN film 13.

The refractive index of the SiN film 13 that was formed in this manner (refractive index with respect to light of a wavelength of 633 nm) is 2.0 or a close value, and the SiN film 13 was a film that is stoichiometry, namely, proper in chemical mass ratio in that the N/Si ratio is 4/3. It is to be noted that the refractive index was measured using an ellipsometry method.

Then, an annealing process for approximately 30 minutes is performed within an $N_2$ atmosphere at approximately 750° C.

In this manner, by forming the SiN film 13 on the GaN cap layer 12 and performing the annealing process, Ga within the GaN cap layer 12 is diffused into the SiN film 13 and N within the SiN film 13 is diffused into the GaN cap layer 12, and consequently, the Ga/N ratio of the GaN cap layer 12 comes to indicate variation along the thicknesswise direction [for example, refer to FIGS. 2A and 2B].

In particular, for example, as depicted in FIG. 2A, the Ga composition of the GaN cap layer 12 is low at the surface side but is high at the opposite side to the surface side (at the barrier layer side). Further, for example, as depicted in FIG. 2B, the N composition of the GaN cap layer 12 is high at the surface side but is low at the opposite side to the surface side (at the barrier layer side). Further, the GaN cap layer 12 contains Si by 1% or more.

In particular, by performing such a step as described above, Ga is removed from the surface side of the GaN cap layer 12 and an accepter is formed from Ga vacancies by the Ga removal, and the influence of excessive positive charge by a donor formed from the N vacancies can be suppressed (compensation effect of a surface donor).

Further, by diffusing N from the surface side such that the N is coupled to N vacancies thereby to reduce the donor in the GaN cap layer 12, the influence of excessive positive charge by the donor formed from the N vacancies can be suppressed (compensation effect of a surface donor).

As a result, in the case where the GaN cap layer 12 is provided on the InAlGaN barrier layer 11 that is an In-based nitride semiconductor, the influence of excessive positive charge is suppressed and the influence on an electric characteristic such as, for example, a threshold value voltage or a pinch off characteristic can be suppressed.

It is to be noted that the annealing process may be performed at approximately 600° C. or more, suitably, at approximately 700° C. or more. In other words, the heat application temperature in the annealing process may be set to approximately 600° C. or more, preferably to approximately 700° C. or more. Further, the annealing process may be performed within vacuum or inactive gas. Further, the annealing process may be performed for approximately 10 minutes or more, preferably for approximately 30 minutes or more. In short, the heat application time in the annealing process may be set to approximately 10 minutes or more, preferably to approximately 30 minutes or more.

Further, since the SiN film 13 formed in such a manner as described above is a stoichiometry film, the SiN film 13 functions as a sacrifice film into which Ga within the GaN cap layer 12 is capable of being diffused and functions also as a sacrifice film capable of diffusing N therefrom into the GaN cap layer 12 [for example, refer to FIGS. 2A and 2B].

It is to be noted that the sacrifice film 13 may be a sacrifice film into which Ga within the GaN cap layer 12 can be diffused or a sacrifice film capable of diffusing N therefrom into the GaN cap layer 12.

For example, by forming the SiN film as the sacrifice film 13, for example, as an H-rich non-stoichiometry film that includes much Si—H or N—H, the diffusion degree of Ga from the GaN cap layer 12 into the SiN sacrifice film 13 can be made high.

Here, the H-rich non-stoichiometry film may have, for example, a hydrogen bonding group concentration of approximately $1 \times 10^{22}/cm^{-3}$ or more. For example, in the case of an H-rich non-stoichiometry film that includes much Si—H, the Si—H concentration may be approximately $1 \times 10^{22}/\text{cm}^{-3}$ or more. Further, for example, in the case of an H-rich non-stoichiometry film that includes much N—H, the N—H concentration may be approximately $1 \times 10^{22}/\text{cm}^{-3}$ or more.

On the other hand, for example, by forming the SiN film as the sacrifice film 13 as an H-rich non-stoichiometry film, the diffusion degree of N from the SiN sacrifice film 13 into the GaN cap layer 12 can be increased.

Further, by increasing one of the diffusion degrees, the sacrifice film 13 into which Ga of the GaN cap layer 12 is capable of being diffused or the sacrifice film 13 capable of diffusing N therefrom into the GaN cap layer 12 can be implemented.

Here, in the case where the sacrifice film 13 is formed as a sacrifice film 13 into which Ga of the GaN cap layer 12 is capable of being diffused, in the GaN cap layer 12, Ga is removed from the surface side and an accepter is formed from Ga vacancies arising from the Ga removal such that the influence of excessive positive charge by the donor formed from the N vacancies can be suppressed (compensation effect of a surface donor).

As a result, in the case where the GaN cap layer 12 is provided on the InAlGaN barrier layer 11 that is an In-based nitride semiconductor, the influence of excessive positive charge is suppressed and the influence on an electric characteristic such as, for example, a threshold value voltage or a pinch off characteristic can be suppressed.

On the other hand, in the case where the sacrifice film 13 is formed as a sacrifice film capable of diffusing N therefrom into the GaN cap layer 12, in the GaN cap layer 12, N is diffused from the surface side and is coupled to N vacancies to reduce the donor such that the influence of excessive positive charge by the donor formed from the N vacancies is suppressed (reduction effect of a surface donor).

As a result, in the case where the GaN cap layer 12 is provided on the InAlGaN barrier layer 11 that is an In-based nitride semiconductor, the influence of excessive positive charge is suppressed and the influence on an electric characteristic such as, for example, a threshold value voltage or a pinch off characteristic can be suppressed.

In this manner, the Ga/N ratio of the GaN cap layer may be varied along the thicknesswise direction by forming the sacrifice film 13 into which Ga within the GaN cap layer 12 is capable of being diffused or the sacrifice film 13 capable of diffusing N therefrom into the GaN cap layer 12 on the GaN cap layer 12 and performing an annealing process at 600° C. or more (preferably at approximately 700° C. or more).

It is to be noted that, in the case where the sacrifice film 13 into which Ga within the GaN cap layer 12 is capable of being diffused is formed, the sacrifice film 13 comes to contain Ga by performing such a process as described above.

Further, the SiN film 13 is a sacrifice film containing Si. Here, the sacrifice film containing Si is not limited to the SiN film, and, for example, a SiON film, a $SiO_2$ film, a polysilicon film or the like may be used. By forming a sacrifice film containing Si as the sacrifice film 13 in this manner, the sacrifice film 13, which is removed after the Ga/N ratio of the GaN cap layer 12 is varied along the thicknesswise direction as described above, can be removed easily as hereinafter described.

Figure 3C:
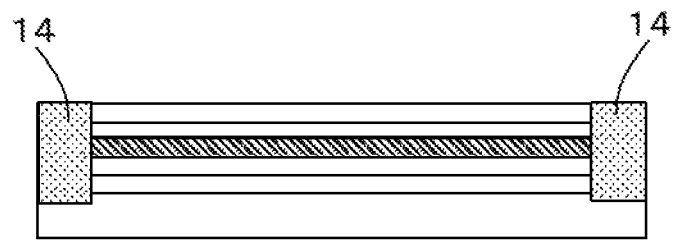

Thereafter, as depicted in FIG. 3C, for example, wet etching using HF is performed to remove the SiN film 13 formed on the nitride semiconductor stacked structure 2.

Then, as depicted in FIG. 3C, for example, Ar is selectively injected by ion implantation into a surface layer portion of the nitride semiconductor stacked structure 2 and the SiC substrate 1 to perform inter-element isolation to define an element isolation region 14 that defines an active region.

It is to be noted that the depth of the ion implantation is an example, and the depth is not limited to this if inter-element isolation can be implemented.

This step is a step for forming the element isolation region 14 on the nitride semiconductor stacked structure 2 by ion implantation. Further, the annealing process for varying the Ga/N ratio of the GaN cap layer along the thicknesswise direction is preferably performed before the process for forming the element isolation region 14.

Consequently, such a situation can be suppressed that the function of the element isolation region 14 is degraded by restoration of carriers in the element isolation region 14 by an annealing process for varying the Ga/N ratio of the GaN cap layer 12 along the thicknesswise direction described above.

Figure 4A:
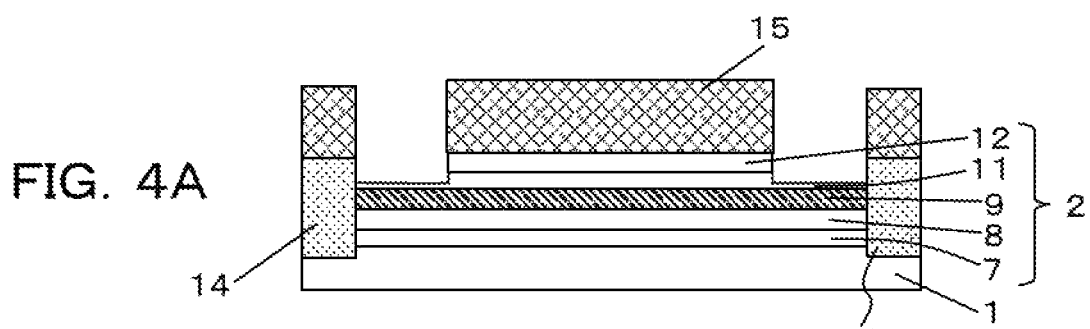

Thereafter, as depicted in FIG. 4A, a resist pattern (recess portion formation resist pattern) 15 having an opening within a scheduled source electrode format ion region and a scheduled drain electrode formation region is formed on the nitride semiconductor stacked structure 2, for example, by photolithography.

Then, the GaN cap layer 12 and part of the InAlGaN barrier layer 11 within the scheduled source electrode formation region and the scheduled drain electrode formation region is removed, for example, by dry etching using inactive gas and chlorine gas such as $Cl_2$ gas using the resist pattern 15 as a mask.

It is to be noted that the etching depth in the semiconductor region may be set, for example, to 8 nm. Further, while even part of the InAlGaN barrier layer 11 here is removed, the etching depth is not limited to this, and all or only part of the GaN cap layer 12 may be removed.

After the recess portion 16 is formed as described above, the resist patter 15 is removed, for example, by warmed organic solvent.

Figure 4B:
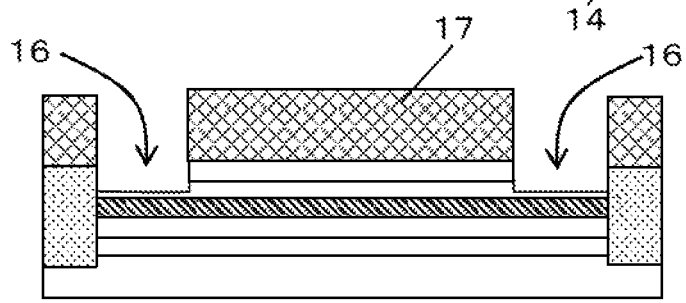

Thereafter, as depicted in FIG. 4B, a resist pattern (metal electrode formation resist pattern) 17 having an opening within the scheduled source electrode formation region and the scheduled drain electrode formation region is formed on the nitride semiconductor stacked structure 2 once again, for example, by photolithography.

Figure 4C:
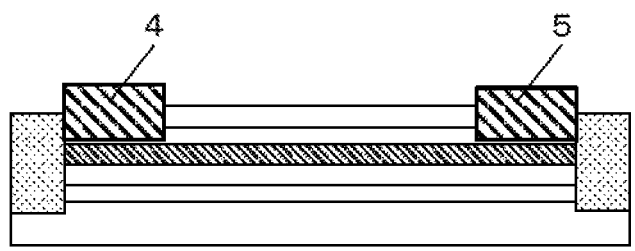

Then, as depicted in FIG. 4C, a source electrode 4 and a drain electrode 5 are formed in the recess portion 16 formed within the scheduled source electrode formation region and the scheduled drain electrode formation region at the GaN cap layer 12 and part of the InAlGaN barrier layer 11.

Here, after Ti (for example, a thickness of approximately 20 nm) and Al (for example, a thickness of approximately 200 nm) are vapor deposited in order, for example, by a vapor deposition method (here, a high vacuum vapor deposition method), liftoff is performed, namely, the resist pattern 17 having the opening is removed, such that the source electrode 4 and the drain electrode 5 as a pair of ohmic electrodes are formed on the InAlGaN barrier layer 11.

Thereafter, by performing an annealing process (alloying process), for example, at approximately 590° C., ohmic contact between the source electrode 4 and drain electrode 5 as the ohmic electrodes and the semiconductor (here, the InAlGaN barrier layer 11) is established.

This step is a step for forming the ohmic electrodes (source electrode 4 and drain electrode 5) on the nitride semiconductor stacked structure 2. The annealing process for varying the Ga/N ratio of the GaN cap layer 12 along the thicknesswise direction described above is performed preferably before the step for forming the ohmic electrodes.

Consequently, such a situation can be suppressed that a characteristic of ohmic electrodes (source electrode 4 and drain electrode 5) is degraded by an annealing process for varying the Ga/N ratio of the GaN cap layer 12 along the thicknesswise direction described above, namely, by an annealing process performed at a higher temperature than that of the annealing process for establishing ohmic contact.

Figure 4D:
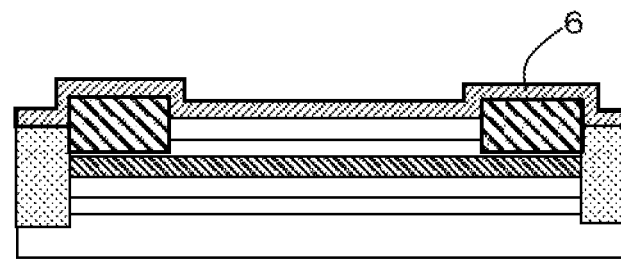

Then, as depicted in FIG. 4D, a nitride silicon film (SiN film) as a passivation insulating film 6 is formed so as to cover the surface of the nitride semiconductor stacked structure 2.

Here, for example, using a plasma CVD (PCVD) method, silicon nitride (SiN) is deposited, for example, by approximately 50 nm using, for example, silan or ammonium as a material to form a nitride silicon film (SiN film) 6 on the surface of the nitride semiconductor stacked structure 2 on which the source electrode 4 and the drain electrode 5 as ohmic electrodes are formed.

The refractive index (refractive index with respect to light of a wavelength 633 nm) of the nitride silicon film 6 that was formed in this manner is 2.0 or a close value, and the nitride silicon film 6 was a film that is stoichiometry, namely, proper in chemical mass ratio in that the N/Si ratio is 4/3. It is to be noted that the refractive index was measured using an ellipsometry method.

It is to be noted that, if the annealing process for varying the Ga/N ratio of the GaN cap layer 12 along the thicknesswise direction described above is performed after the SiN film as such a passivation insulating film 6 as described above is formed, then the function as the passivation insulating film 6 degrades, which is not preferable.

Figure 4E:
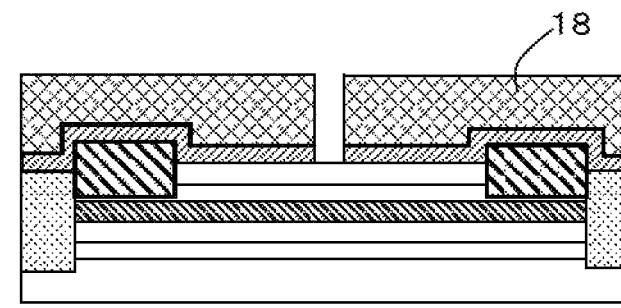

Then, as depicted in FIG. 4E, gate opening formation electron beam resist is applied and an electron beam is introduced, for example, by a length of approximately 0.1 μm in a current direction into a gate opening formation region to photosensitize and develop the resist thereby to form a gate opening formation resist pattern 18 having an opening in the gate opening formation region.

Here, the gate opening formation electron beam resist is configured, for example, from a single layer and is configured from PMMA (by MicroChem USA). The gate opening formation electron beam resist is formed, for example, by a spin coating method and prebaking.

Then, a gate opening (opening width of approximately 0.1 μm; SiN opening for a gate electrode) is formed on the nitride silicon film (SiN film) as the passivation insulating film 6 by dry etching using, for example, $SF_6$ as etching gas using the gate opening formation resist pattern 18 as a mask. Thereafter, the gate opening formation resist pattern 18 is removed.

Then, as depicted in FIG. 5A, a gate electrode formation electron beam resist 19 is applied.

Here, the gate electrode formation electron beam resist 19 is formed, for example, from three layers, and a lower layer resist 19C is configured from PMMA (by MicroChem USA); an intermediate layer resist 19B is configured from PMGI (by MicroChem USA); and an upper layer resist 19A is configured from ZEP 520 (by ZEON Japan).

The gate electrode formation electron beam resist 19 having the three-layer structure is formed, for example, by a spin coating method and prebaking.

After the gate electrode formation electron beam resist 19 having the three-layer structure is formed in this manner, an electron beam is introduced, for example, by a length of approximately 0.8 μm in the current direction into the upper layer resist 19A in the gate electrode formation region to photosensitize the resist (electron beam drawing). Then, the resist is developed using, for example, the developer ZEP-SD (by ZEON Japan) to form an opening having a length of approximately 0.8 μm on the upper layer resist 19A.

Further, development is performed using, for example, the developer NMD-W (by Tokyo Ohka), and the intermediate layer resist 19B within a region set back by approximately 0.5 μm from an opening end of the upper layer resist 19A toward an ohmic electrode direction is removed.

Then, an electron beam is introduced, for example, by a length of approximately 0.1 or more in the current direction to a central portion of the opening formed on the upper layer resist 19A and the intermediate layer resist 19B so as to include the gate electrode SiN opening described above to photosensitize the resist (electron beam drawing). Then, for example, the resist is developed using the developer ZMD-B (by ZEON Japan) to form an opening having a length of approximately 0.1 μm or more on the lower layer resist 19C.

After the gate electrode formation opening is formed in this manner, a Ni layer (for example, a thickness of approximately 10 nm) and an Au layer (for example, a thickness of approximately 300 nm) that configure the gate electrode 3 are vapor deposited, for example, by a vapor deposition method (here, a high vacuum vapor deposition method) as depicted in FIG. 5B. It is to be noted that, in FIG. 5B, illustration of metal (gate metal) to be fitted on the resist 19A is omitted.

Then, as depicted in FIG. 5C, liftoff is performed using, for example, warmed organic solvent to remove the gate electrode formation electron beam resist 19 having the three-layer structure and unnecessary metal (gate metal) to form the gate electrode 3 on the GaN cap layer 12.

Thereafter, though not depicted, the present semiconductor device is completed through formation steps of an inter-layer insulating film, a contact hole, various wires and so forth.

It is to be noted that, while the embodiment is described taking, as an example, a case of the Schottky structure, the structure of the semiconductor device is not limited to this and may be an MIS (Metal-Insulator-Semiconductor) structure.

In this case, in the semiconductor device of the embodiment described above, the insulating film 6 may be formed from an SiN film, an AlO film ($Al_2O_3$ film) or the like suitable for a gate insulating film such that the gate electrode 3 is formed on the insulating film 6 without providing the gate opening.

Further, at the step being described with reference to FIG. 4D in the fabrication method for a semiconductor device described above, a SiN film, an AlO film ($Al_2O_3$ film) or the like suitable for a gate insulating film may be formed in place of the nitride silicon film (SiN film) as the passivation insulating film 6 while the step described with reference to FIG. 4E is omitted.

Accordingly, with the semiconductor device and the fabrication method therefor according to the present embodiment, an advantageous effect is achieved that, in the case where a material containing In is used for the barrier layer 11 and the cap layer 12 that contains GaN but does not contain Al is provided, the influence on an electric characteristic such as, for example, a threshold value voltage or a pinch off characteristic is suppressed.

Here, FIG. 6A depicts a characteristic (Ids-Vgs characteristic) of an InAlGaN/GaN HEMT that does not include a GaN cap layer, and FIG. 6B depicts a characteristic (Ids-Vgs characteristic) of another InAlGaN/GaN HEMT that includes a GaN cap layer that is poor in quality.

As depicted in FIG. 6A, in the InAlGaN/GaN HEMT that does not include a GaN cap layer, an electric characteristic close to a theoretical value is indicated.

However, if a GaN cap layer is not provided and the InAlGaN barrier layer containing In or Al is exposed to the surface, then it is difficult to secure the reliability in that an electric characteristic varies due to, for example, an influence of oxidation or the like.

On the other hand, as depicted in FIG. 6B, in the InAlGaN/GaN HEMT that includes a GaN cap layer that is poor in quality, abnormal deepening of the threshold value voltage is found. In particular, in the InAlGaN/GaN HEMT that includes a GaN cap layer that is poor in quality, a negative side shift (minus shift) of −1 V or more from a theoretical threshold value (theoretical value) is found. Also pinch off failure (Vds dependency of the threshold value) is found. This is because, in the GaN cap layer that is poor in quality, a donor is formed from N vacancies and excessive positive charge is generated.

In contrast, with the semiconductor device and the fabrication method therefor according to the embodiment described above, such a subject as described above can be solved and an InAlGaN/GaN HEMT including a GaN cap layer that does not have an influence on an electrical characteristic can be implemented.

Figure 7:
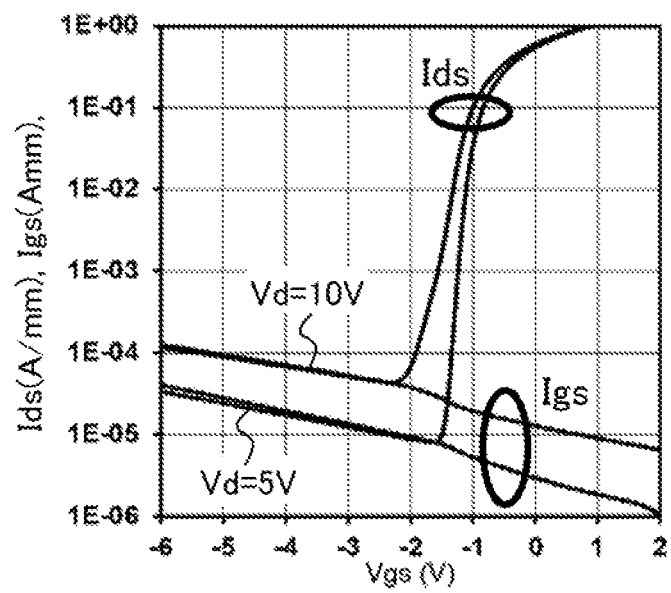
FIG. 7 is a view depicting a characteristic (Ids-Vgs characteristic) of an InAlGaN/GaN HEMT that is the semiconductor device according to the first embodiment and includes a GaN cap layer.

FIG. 7 depicts a characteristic (three-terminal characteristic; Ids-Vgs characteristic) of an InAlGaN/GaN HEMT that includes the GaN cap layer 12 configured as in the embodiment described above.

In an InAlGaN/GaN HEMT that includes the GaN cap layer 12 configured inn such a manner as in the embodiment described above, since the influence of excessive positive charge is suppressed, an electric characteristic close to a theoretical value, namely, a threshold value voltage close to a theoretical value, and a good pinch off characteristic are indicated as depicted in FIG. 7, and it is recognized that the electric characteristic is improved.

From the natures described above, for example, in the case of application to a high-output and high-frequency amplifier, it is possible to implement increase of the output and the efficiency of the amplifier.

In short, it is possible to improve an electric characteristic of a HEMT that has a nitride semiconductor stacked structure having a GaN cap to implement a device for a high-output and high-frequency amplifier or the like.

Incidentally, the reason why such a configuration and a fabrication method as in the embodiment described above are applied is such as follows.

In order to implement a high output of a device, in a high-frequency and high-output device for which a compound semiconductor, especially, a GaN HEMT, is used, it is examined that an In-based nitride semiconductor such as InAlN or InAlGaN that has high spontaneous polarization or high piezoelectric polarization for a GaN channel layer is used for an electron supply layer in place of a conventional AlGaN electron supply layer (barrier layer).

Especially, since an electron supply layer for which an In-based nitride semiconductor having high spontaneous polarization is used can induce secondary electron gas (2DEG) of a high concentration even if the electron supply layer is formed as a thinned layer, it attracts attention as a material that has both of a high output performance and a high frequency.

However, if an In-based nitride semiconductor is used for an electron supply layer and this is exposed to the surface, then an electric characteristic is varied, for example, by an influence of oxidation or the like.

On the other hand, in an AlGaN/GaN HEMT, in order to protect an AlGaN electron supply layer containing Al, which is liable to oxidize, to achieve chemical stabilization of the surface and suppression of current collapse, a GaN cap layer is adopted.

In this regard, also in the case where it is tried to use an In-based nitride semiconductor such as, for example, InAlN or InAlGaN for an electron supply layer to implement a high-frequency and high-output compound semiconductor HEMT device, if Al is contained in the electron supply layer (especially in the case where a high Al composition electron supply layer is used), it is preferable to cover the surface with a GaN cap layer that does not contain Al that is liable to oxidize in order to protect the surface from oxidation thereby to achieve chemical stabilization of the surface and suppression of current collapse.

Therefore, it is conceivable to provide a GaN cap layer also in the case where an In-based nitride semiconductor is used for an electron supply layer. However, in the case where an In-based nitride semiconductor is used for an electron supply layer, it is difficult to form a GaN cap layer of high quality.

In particular, a suitable growth temperature of an In-based nitride semiconductor is lower by approximately several hundred degrees than a suitable growth temperature of GaN.

Therefore, a GaN cap layer cannot grow at a suitable growth temperature of GaN, but a GaN cap layer is grown, for example, at a suitable growth temperature of an In-based nitride semiconductor, namely, a temperature lower by approximately several hundred degrees than a suitable growth temperature of GaN. Therefore, it is difficult to form a GaN cap layer having high quality on an In-based nitride semiconductor.

As a result, if a GaN cap layer is provided in the case where an In-based nitride semiconductor is used for an electron supply layer, then the GaN cap layer becomes a low-quality GaN cap layer that is poor in quality.

Figure 8A:
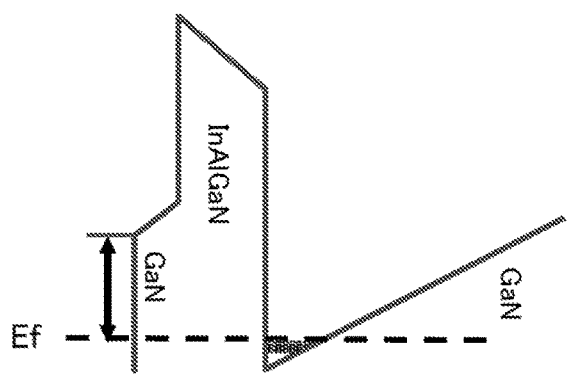
FIGS. 8A and 8B are views illustrating a subject of the present embodiment.
Figure 8B:
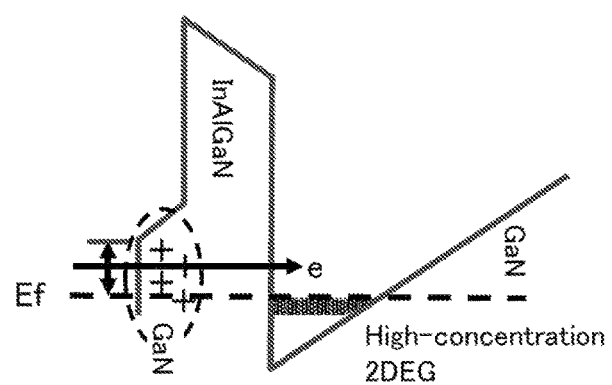

Here, FIG. 8A is a band diagram depicting conduction band energy in the GaN cap layer, InAlGaN barrier layer and GaN electron transit layer in the case where a GaN cap layer having high quality is formed successfully, and FIG. 8B is a band diagram depicting conduction band energy in a GaN cap layer that are low in quality, an InAlGaN barrier layer and a GaN electron transit layer.

Although such a band structure as depicted in FIG. 8A is formed in the case where a GaN cap layer having high quality is formed successfully, it is difficult to form a GaN cap layer having high quality on an In-based nitride semiconductor as described above.

In contrast, in a low-quality GaN cap layer, as depicted in FIG. 8B, a donor is formed from N vacancies and excessive positive charge is generated. Further, a residual carrier (positive charge) is sometimes generated on a cap layer/barrier layer interface and in the proximity of the interface or some trap is sometimes generated. As a result, the band lowers and the barrier is reduced effectively with respect to the Fermi level, resulting in increase of tunnel current. In short, the barrier performance with respect to the gate electrode is degraded and leak current increases. Then, from an influence of them, a characteristic fault such as abnormal deepening of a threshold value voltage that the threshold value shifts from a theoretical threshold value to the negative side by −1 V or more or pinch off failure or the like occurs.

Therefore, in order to solve the subject on an electric characteristic arising from a low-quality GaN cap layer, such a configuration and a fabrication method as described in the foregoing description of the embodiment are adopted.

Second Embodiment

Now, a high-frequency amplifier according to a second embodiment is described with reference to FIG. 9.

The high-frequency amplifier according to the present embodiment is a high-frequency amplifier (high-output amplifier) that includes the semiconductor device (HEMT; transistor) of the first embodiment or the modification described above.

Figure 9:
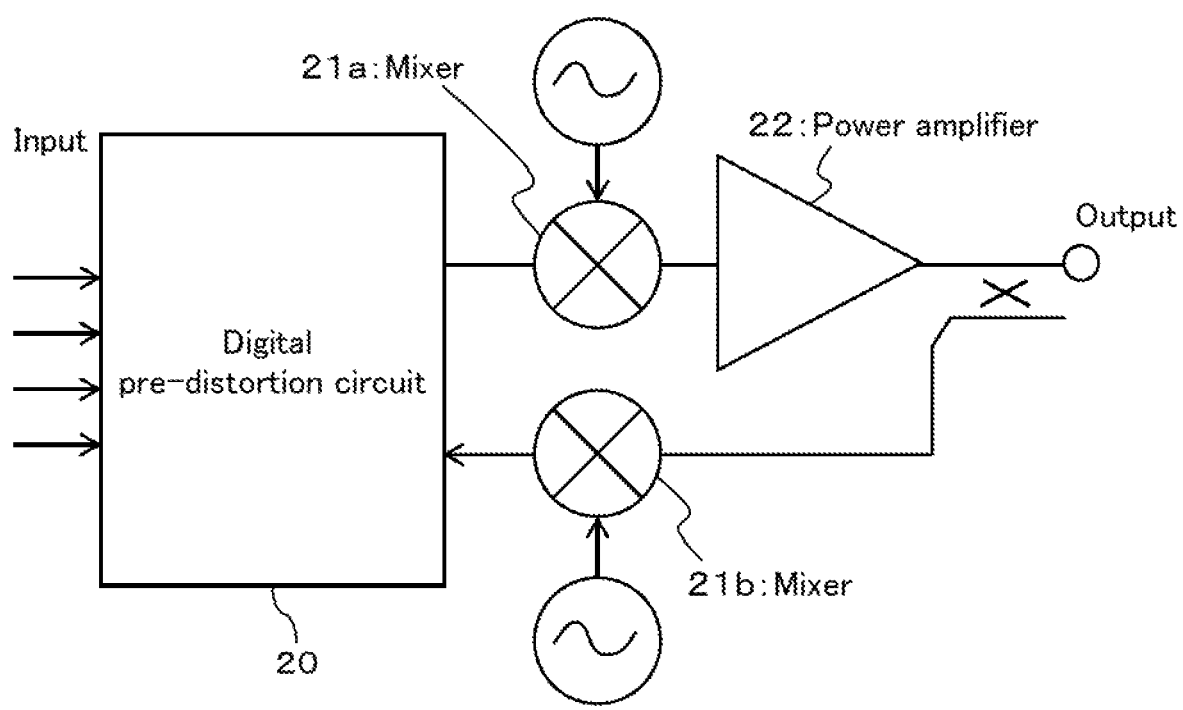
FIG. 9 is a schematic view depicting a configuration of a high-frequency amplifier of a second embodiment.

As depicted in FIG. 9, the present high-frequency amplifier includes a digital pre-distortion circuit 20, mixers 21a and 21b and a power amplifier 22. It is to be noted that the power amplifier is hereinafter referred to simply as amplifier.

The digital pre-distortion circuit 20 compensates for non-linear distortion of an input signal.

The mixers 21a and 21b perform mixing of an input signal whose non-linear distortion is compensated for and an alternating current signal.

The power amplifier 22 amplifies the input signal mixed with the alternating current signal and includes the semi-conductor device (HEMI; transistor) of the first embodiment or the modification described above.

It is to be noted that, in FIG. 9, the high-frequency amplifier is configured such that, for example, by change-over of a switch, a signal at the output side can be mixed with the alternating current signal by the mixer 21b and sent out to the digital pre-distortion circuit 20.

Accordingly, the high-frequency amplifier according to the present embodiment is advantageous in that, since the semiconductor device (HEMT; transistor) of the first embodiment or the modification described above is applied to the power amplifier 22, a high-frequency amplifier having high reliability can be implemented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
a nitride semiconductor stacked structure that includes a channel layer containing GaN and a barrier layer containing In and further includes a cap layer that contains GaN on the outermost surface but does not contain Al; wherein
in the cap layer, a Ga/N ratio varies along a thicknesswise direction such that a Ga composition is low at the surface side but is high at the opposite side to the surface side.

2. A semiconductor device, comprising:
a nitride semiconductor stacked structure that includes a channel layer containing GaN and a barrier layer containing In and further includes a cap layer that contains GaN on the outermost surface but does not contain Al; wherein
in the cap layer, a Ga/N ratio varies along a thicknesswise direction such that an N composition is high at the surface side but is low at the opposite side to the surface side.

3. The semiconductor device according to claim 1, wherein, in the cap layer, the Ga/N ratio varies along the thicknesswise direction such that an N composition is high at the surface side but is low at the opposite side to the surface side.

4. The semiconductor device according to claim 1, wherein, in the cap layer, Si of 1% or more is contained.

5. The semiconductor device according to claim 1, wherein the cap layer further contains In.

* * * * *